United States Patent
Jiang et al.

(10) Patent No.: US 10,192,894 B2
(45) Date of Patent: Jan. 29, 2019

(54) THIN FILM TRANSISTOR AND METHOD OF MANUFACTURING THE SAME, ARRAY SUBSTRATE AND DISPLAY PANEL

(71) Applicants: BOE Technology Group Co., Ltd., Beijing (CN); Hefei Xinsheng Optoelectronics Technology Co., Ltd., Anhui (CN)

(72) Inventors: Tao Jiang, Beijing (CN); Junhao Han, Beijing (CN); Botao Song, Beijing (CN); Liang Lin, Beijing (CN)

(73) Assignees: BOE TECHNOLOGY GROUP CO., LTD., Beijing (CN); HEFEI XINSHENG OPTOELECTRONICS TECHNOLOGY CO., LTD, Anhui (CN)

( * ) Notice: Subject to any disclaimer, the term of this patent is extended or adjusted under 35 U.S.C. 154(b) by 289 days.

(21) Appl. No.: 15/143,810

(22) Filed: May 2, 2016

(65) Prior Publication Data
US 2017/0053939 A1 Feb. 23, 2017

(30) Foreign Application Priority Data

Aug. 19, 2015 (CN) .......................... 2015 1 0512174

(51) Int. Cl.
*H01L 27/12* (2006.01)
(52) U.S. Cl.
CPC ........ *H01L 27/124* (2013.01); *H01L 27/1248* (2013.01)
(58) Field of Classification Search
CPC .... H01L 27/12; H01L 27/124; H01L 27/1248
(Continued)

(56) References Cited

U.S. PATENT DOCUMENTS

2014/0167034 A1 6/2014 Liu et al.
2016/0064415 A1* 3/2016 Zhan ..................... H01L 27/124
                                                        257/72
2016/0254289 A1 9/2016 Bai et al.

FOREIGN PATENT DOCUMENTS

CN          203117620 U    8/2013
CN          103915431 A    7/2014
(Continued)

OTHER PUBLICATIONS

Second Office Action from Chinese Patent Application No. 201510512174.0, dated Dec. 4, 2017, 13 pages.
(Continued)

*Primary Examiner* — Monica D Harrison
(74) *Attorney, Agent, or Firm* — Westman, Champlin & Kohler, P.A.

(57) ABSTRACT

Embodiments of the present application provide a thin film transistor and a method of manufacturing the same, an array substrate and a display panel. The thin film transistor comprises, successively from the bottom up, a gate, a first common electrode located in the same layer as the gate, a gate insulating layer, an active layer, a pixel electrode, a source-drain electrode layer and a passivation layer located above the layer where the gate is located, and a second common electrode located on the passivation layer, and the thin film transistor further comprises at least one connection electrode located in a same layer as the pixel electrode, wherein at least two via holes are provided between the first common electrode and the second common electrode so as to connect the first common electrode and the second common electrode through the connection electrode.

19 Claims, 5 Drawing Sheets

(58) Field of Classification Search
 USPC .......................................................... 257/72
 See application file for complete search history.

(56) References Cited

FOREIGN PATENT DOCUMENTS

| | | |
|---|---|---|
| CN | 103928400 A | 7/2014 |
| CN | 104332473 A | 2/2015 |

OTHER PUBLICATIONS

Rejection Decision for Chinese Patent Application No. 201510512174. 0, dated Feb. 2, 2018, 12 pages.
First Office Action from Chinese Patent Application No. 201510512174. 0, dated Jul. 4, 2017, 12 pages.

* cited by examiner

THIN FILM TRANSISTOR AND METHOD OF MANUFACTURING THE SAME, ARRAY SUBSTRATE AND DISPLAY PANEL

CROSS-REFERENCE TO RELATED APPLICATION

This application claims the benefit of Chinese Patent Application No. 201510512174.0 filed on Aug. 19, 2015 in the State Intellectual Property Office of China, the whole disclosure of which is incorporated herein by reference.

BACKGROUND OF THE INVENTION

Field of the Invention

The present application relates to the technical field of display panels, and particularly, to a thin film transistor and a method of manufacturing the same, an array substrate, and a display panel.

Description of the Related Art A thin film transistor liquid crystal display (TFT-LCD) is a mainstream display in the current market of flat panel display due to its advantages such as small volume, light weight, low power consumption, availability in manufacturing a large-sized panel, no radiation or the like. TFT-LCD is mainly consisted of a TFT substrate and a color filter (CF) substrate, wherein the TFT substrate comprises an array of pixels, each of which being controlled by one TFT so as to display an image. The array of pixels may be formed by repeatedly performing processes such as thin film coating/deposition, exposure with mask, etching and the like.

Each pixel generally comprises TFT(s), a pixel electrode, a common electrode, a gate line, a data line and the like. Connections between electrodes are different for different display modes. Taking a HADS product as an example, as shown in FIG. 1, which is a top view of a pixel unit of a display panel in prior arts and shows following parts: a gate line 91 connected with a gate, a first common electrode 1022, a data line 93 connected with a drain electrode of a TFT, a source electrode line 94 connected with a source electrode of the TFT, an active layer 104 of the TFT, a second common electrode 108, and a via hole 98 through which the first common electrode is connected with the second common electrode. FIG. 2 is a section view taken along line A1-A2 and line D1-D2. As can be seen from FIG. 2, the gate 1021, a gate insulating layer 103, the active layer 104, a pixel electrode 105, the drain electrode 1062, the source electrode 1061, a passivation layer 107, and the second common electrode 108 located on the passivation layer are formed on a base substrate successively from the bottom up, wherein the first common electrode 1022 is also located in a same layer as the gate and is connected with the second common electrode 108 through the via hole 98. The via hole 98 has a depth equal to a sum of thicknesses of the gate insulating layer and the passivation layer. Thus, the depth of the via hole is generally larger, which will lead to defects associated therewith. For example, since the depth of the via hole is generally larger, a poor lapping connection will be likely caused and disconnection will be formed when an angle of slope of the via hole is larger, resulting in bright spot(s) in displayed images; further, the deeper via hole will likely result in uneven spreading in PI coating, which will form defects that cause greater adverse effects on the displayed images.

To sum up, only one via hole is used to achieve connection between the first common electrode and the second common electrode in the existing thin film transistor, and the depth of the via hole is equal to the sum of thicknesses of the gate insulating layer and the passivation layer and thus is larger, which results in lower success ratio for lapping connection between the second common electrode and the first common electrode, thereby aggravating the phenomenon where defective pixel(s) occurs in the display panel during PI coating.

SUMMARY

Embodiments of the present application provide a thin film transistor and a method of manufacturing the same, an array substrate and a display panel, for at least partially reducing the depth of the via hole for achieving the connection between the first common electrode and the second common electrode, increasing the success ratio of lapping connection between the second common electrode and the first common electrode, while reducing the phenomenon where defective pixel(s) occurs in the display panel during PI coating.

According to a first aspect of the present application, there is provided a thin film transistor comprising, successively from the bottom up, a gate, a first common electrode located in a same layer as the gate, a gate insulating layer, an active layer, a pixel electrode, a source-drain electrode layer and a passivation layer located above the layer where the gate is located, and a second common electrode located on the passivation layer, wherein, the thin film transistor further comprises at least one connection electrode located in a same layer as the pixel electrode, wherein at least two via holes are provided between the first common electrode and the second common electrode so as to connect the first common electrode and the second common electrode through the connection electrode.

According to a second aspect of the present application, there is provided an array substrate comprising the thin film transistor as described above.

According to a third aspect of the present application, there is provided a display panel comprising the array substrate as described above.

According to a fourth aspect of the present application, there is provided a method of manufacturing the above thin film transistor, comprising forming the gate, the first common electrode and the gate insulating layer successively on a base substrate, wherein the gate is located in a same layer as the first common electrode, and the method further comprises:

forming the active layer on the gate insulating layer, and forming a first via hole in a portion of the gate insulating layer located on the first common electrode;

forming the pixel electrode after forming the active layer, and forming the connection electrode at the first via hole such that the connection electrode is connected with the first common electrode through the first via hole;

forming a drain electrode and a source electrode corresponding to the active layer;

forming the passivation layer, and forming a second via hole in a portion of the passivation layer located on the connection electrode;

forming the second common electrode on the passivation layer such that the second common electrode is connected with the connection electrode through the second via hole.

According to a fifth aspect of the present application, there is provided a method of manufacturing the above thin film transistor, comprising forming the gate, the first common electrode and the gate insulating layer successively on a base substrate, wherein the gate is located in a same layer as the first common electrode, and the method further comprises:

forming the active layer on the gate insulating layer, and forming a first via hole in a portion of the gate insulating layer located on the first common electrode;

forming the pixel electrode after forming the active layer, and forming the connection electrode at the first via hole such that the connection electrode is connected with the first common electrode through the first via hole;

forming a drain electrode, a source electrode and a third common electrode at the same time such that the third common electrode is connected with the connection electrode;

forming the passivation layer, and forming a second via hole in a portion of the passivation layer located on the third common electrode;

forming the second common electrode on the passivation layer such that the second common electrode is connected with the third common electrode through the second via hole.

In an embodiment of the present application, the first common electrode is connected with the second common electrode through the first via hole, the connection electrode and the second via hole, that is, the connection between the first common electrode and the second common electrode is achieved through the two via holes and the connection electrode between the two via holes, so that respective via holes have smaller depths, which are respectively equal to the thickness of the gate insulating layer and the thickness of the passivation layer, and the success ratio in lapping and connecting the connection electrode with the first common electrode through the first via hole will be higher, and also, the success ratio in lapping and connecting the second common electrode with the connection electrode through the second via hole will be higher, thereby the success ratio for lapping connection between the second common electrode and the first common electrode may be increased as a whole, while the phenomenon where defective pixel(s) occurs in the display panel during PI coating may be reduced.

In an embodiment of the present application, the first common electrode is connected with the second common electrode through the first via hole, the connection electrode and the second via hole, that is, the connection between the first common electrode and the second common electrode is achieved through the two via holes and the connection electrode between the two via holes, so that respective via holes have smaller depths, which are respectively equal to the thickness of the gate insulating layer and the thickness of the passivation layer, thus the success ratio in lapping and connecting the connection electrode with the first common electrode through the first via hole will be higher, and also, the success ratio in lapping and connecting the second common electrode with the connection electrode through the second via hole will be higher, thereby the success ratio for lapping connection between the second common electrode and the first common electrode may be increased as a whole, while the phenomenon where defective pixel(s) occurs in the display panel during PI coating may be reduced. Further, no new mask will be added for manufacturing the thin film transistor provided according to the embodiments of the present application.

DETAILED DESCRIPTION OF THE EMBODIMENTS

Figure 1:
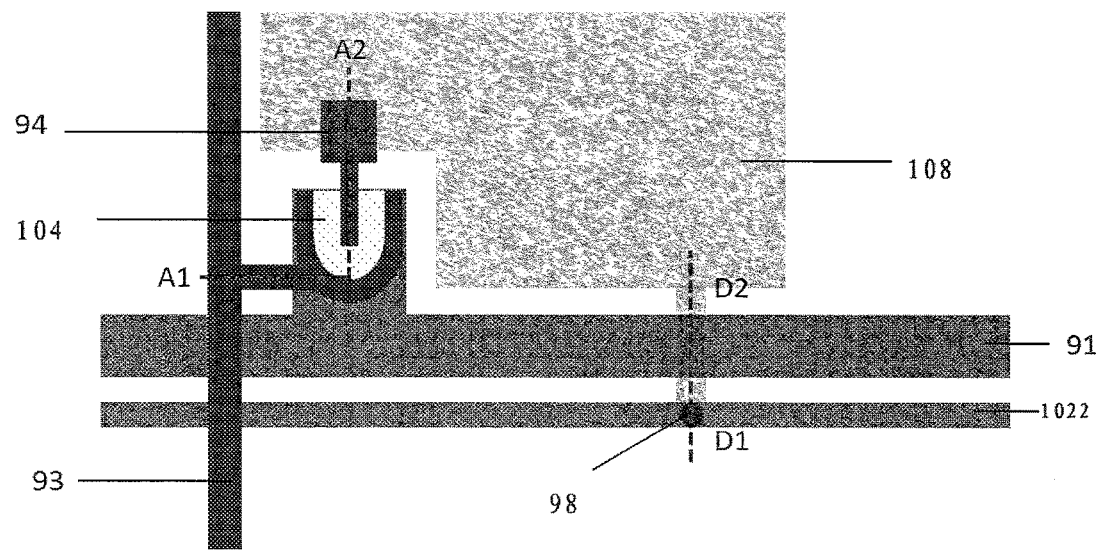
FIG. 1 is a top view of a thin film transistor in prior arts.
Figure 2:
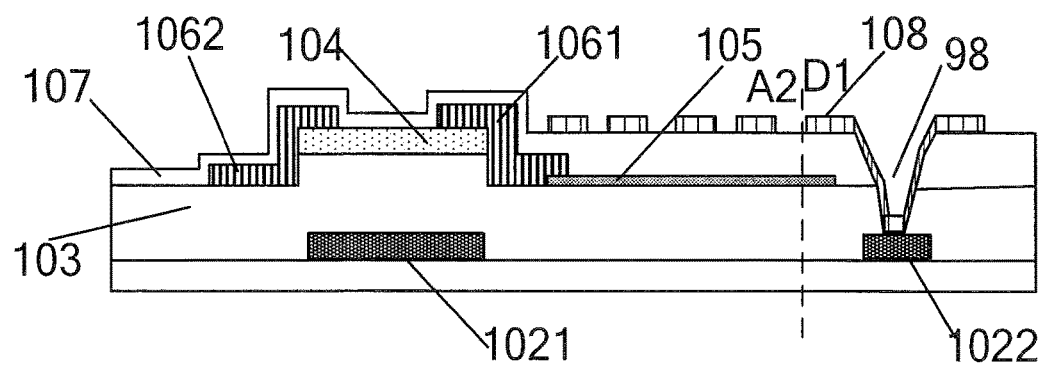
FIG. 2 is a section view of a thin film transistor in prior arts.

In order to make clearer understanding of objects, technique solutions and advantages of the present application, the present application will be further described hereinafter in detail with reference to attached drawings. Obviously, the described embodiments are only some, rather than all, of embodiments of the present application. Based on the embodiments of the present application, all of other embodiments obtained by those skilled in the art without any creative work will fall within the protective scope of the present application.

Embodiments of the present application provide a thin film transistor and a method of manufacturing the same, an array substrate and a display panel, for at least partially reducing the depth of the via hole for achieving the connection between the first common electrode and the second common electrode, increasing the success ratio for lapping connection between the second common electrode and the first common electrode, while reducing the phenomenon where defective pixel(s) occurs in the display panel during PI coating.

Exemplary implementations of the thin film transistor and the method of manufacturing the same, the array substrate and the display panel according to embodiments of the present application will be described in detail with reference to the attached drawings.

In the drawings, thicknesses, sizes and shapes of various layers of films and regions do not reflect actual scales of parts of the thin film transistor and array substrate, but are only intended to illustrate contents of the present application.

First Embodiment

Figure 3:
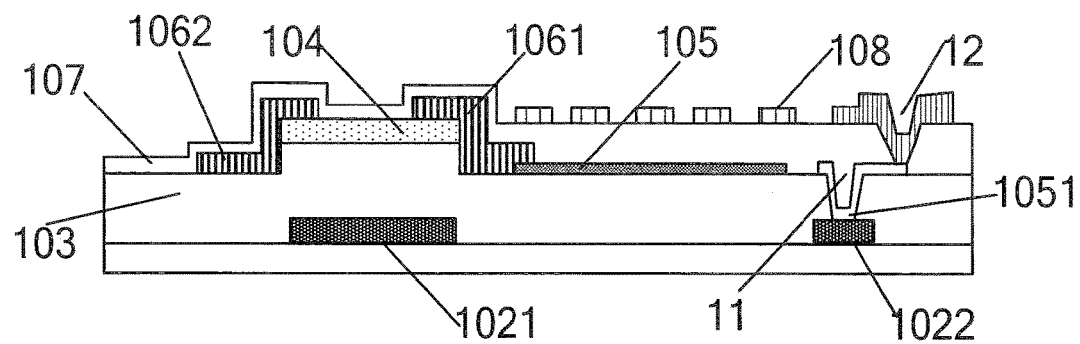
FIG. 3 is a structural schematic diagram of a thin film transistor according to an embodiment of the present application.

As shown in FIG. 3, an embodiment of the present application provides a thin film transistor comprising, successively from the bottom up on a substrate, a gate 1021, a first common electrode 1022 located in a same layer as the gate, a gate insulating layer 103 (located on the layer where the gate lies), an active layer 104, a pixel electrode 105, a source-drain electrode layer (including a source electrode 1061 and a drain electrode 1062) and a passivation layer 107 located above the layer where the gate lies, and a second common electrode 108 located on the passivation layer. The thin film transistor further comprises a connection electrode 1051 located in a same layer as the pixel electrode, wherein the first common electrode 1022 is connected with the connection electrode 1051 through a first via hole 11 provided in the gate insulating layer 103, and the connection electrode 1051 is connected with the second common electrode 108 through a second via hole 12 in the passivation layer 107.

With the thin film transistor according to the embodiment of the present application, the connection electrode is provided in the same layer as the pixel electrode, and the first via hole is provided in a portion of the gate insulating layer located on the first common electrode, such that the connection electrode is connected with the first common electrode through the first via hole; then, the second via hole is provided in a portion of the passivation layer located on the connection electrode, such that the connection electrode is connected with the second common electrode through the second via hole. Thus, the first common electrode is connected with the second common electrode through the first via hole, the connection electrode and the second via hole, that is, the connection between the first common electrode and the second common electrode is achieved through the two via holes and the connection electrode between the two via holes, so that respective via holes have smaller depths, which are respectively equal to the thickness of the gate insulating layer and the thickness of the passivation layer, and the success ratio in lapping and connecting the connection electrode with the first common electrode through the first via hole will be higher, and also, the success ratio in lapping and connecting the second common electrode with the connection electrode through the second via hole will be higher, thereby the success ratio for lapping connection between the second common electrode and the first common electrode may be increased as a whole, while the phenomenon where defective pixel(s) occurs in the display panel during PI coating may be reduced.

It is noted that a third common electrode may be provided in order to reduce resistance between the first common electrode and the second common electrode, which will be described in detail with reference to FIG. 4.

Figure 4:
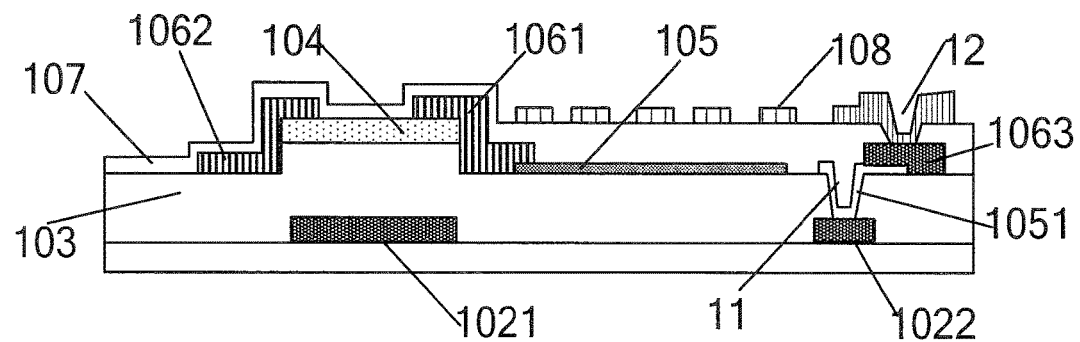
FIG. 4 is a structural schematic diagram of a thin film transistor according to another embodiment of the present application.

In an example, as shown in FIG. 4, the thin film transistor further comprises a third common electrode 1063 located in a same layer as the source-drain electrode layer, wherein the third common electrode 1063 is connected with the connection electrode and is connected with the second common electrode 108 through the second via hole 12 in the passivation layer 107.

In an example, the connection electrode 1051 is a transparent conductive layer.

In an embodiment of the present application, the first via hole 11 has a depth equal to the thickness of the gate insulating layer, the second via hole 12 has a depth equal to the thickness of the passivation layer, the connection electrode 1051 is connected with the first common electrode through the first via hole, the third common electrode is connected with the connection electrode, and the third common electrode is connected with the second common electrode through the second via hole.

It is noted that in embodiments of the present application, the first common electrode and the second common electrode may be connected through the connection electrode and the first and second via holes, or may be connected through the connection electrode, the third common electrode and the first and second via holes. Among others, the position of the connection electrode may be set as required, and will not be particularly limited in embodiments of the present application.

With the thin film transistor according to embodiments of the present application, the connection electrode is provided in the same layer as the pixel electrode, and the first via hole is provided in a portion of the gate insulating layer located on the first common electrode, such that the connection electrode is connected with the first common electrode through the first via hole; the third common electrode is provided in the same layer as the source-drain electrode layer so as to be connected with the connection electrode, and then the second via hole is provided in a portion of the passivation layer located on the third common electrode, such that the third common electrode is connected with the second common electrode through the second via hole. Thus, the first common electrode is connected with the second common electrode through the first via hole, the connection electrode, the third common electrode and the second via hole, that is, the connection between the first common electrode and the second common electrode is achieved through the two via holes and the connection electrode and the third common electrode between the two via holes, so that respective via holes have smaller depths, which are respectively equal to the thickness of the gate insulating layer and the thickness of the passivation layer, and the success ratio in lapping and connecting the connection electrode with the first common electrode through the first via hole will be higher, the success ratio in lapping and connecting the second common electrode with the connection electrode through the second via hole will be also higher, and the success ratio in lapping and connecting the third common electrode with the connection electrode will be also higher, thereby the success ratio for lapping connection between the second common electrode and the first common electrode may be increased as a whole, while the phenomenon where defective pixel(s) occurs in the display panel during PI coating may be reduced.

It will be obvious for those skilled in the art from examples shown in FIGS. 3 and 4 that in the thin film transistor of the present application, being not limited to the two via holes shown, at least two via holes may be provided between the first common electrode and the second common electrode and connected through the connection electrode(s). Numbers of the via holes and the connection electrode(s) between the first common electrode and the second common electrode may be set as desired or required. In addition, it is noted that one or more connection electrode and /or third common electrode may be provided between two adjacent via holes. Exemplary examples are shown in FIGS. 3 and 4 only for purposes of illustration and description, and are not limitative.

Figure 5:
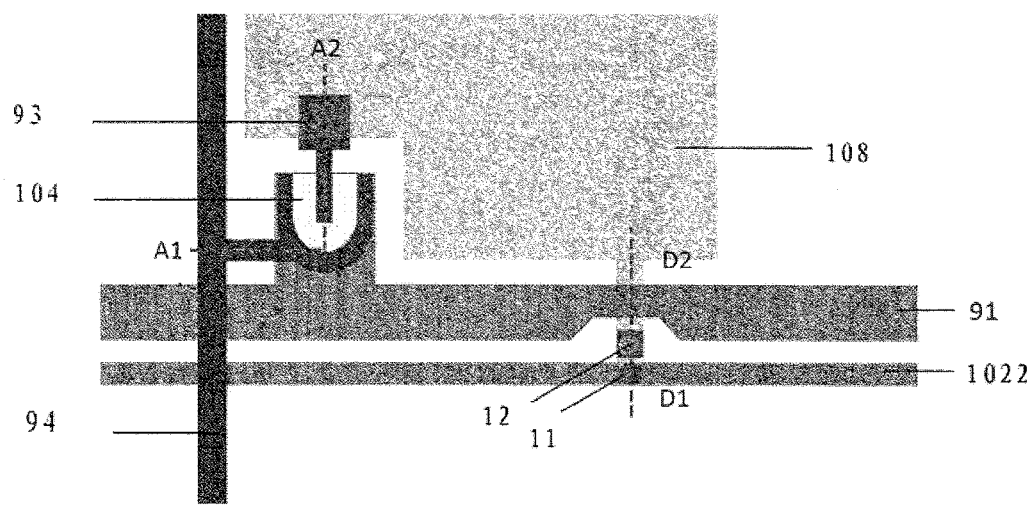
FIG. 5 is a top view of the thin film transistor shown in FIG. 3, according to an embodiment of the present application.

Further, FIG. 5 is a top view of a thin film transistor according to an embodiment of the present application. As can be seen from FIG. 5, two via holes, that is, the first via hole 11 and the second via hole 12, are provided between the second common electrode 108 and the first common electrode 1022. Also shown are a gate line 91 connected with the gate, a data line 93 connected with the drain electrode, and a source electrode line 94 connected with the source electrode.

An embodiment of the present application further provides an array substrate comprising the thin film transistor as described above.

An embodiment of the present application further provides a display panel comprising the above array substrate.

Figure 6:
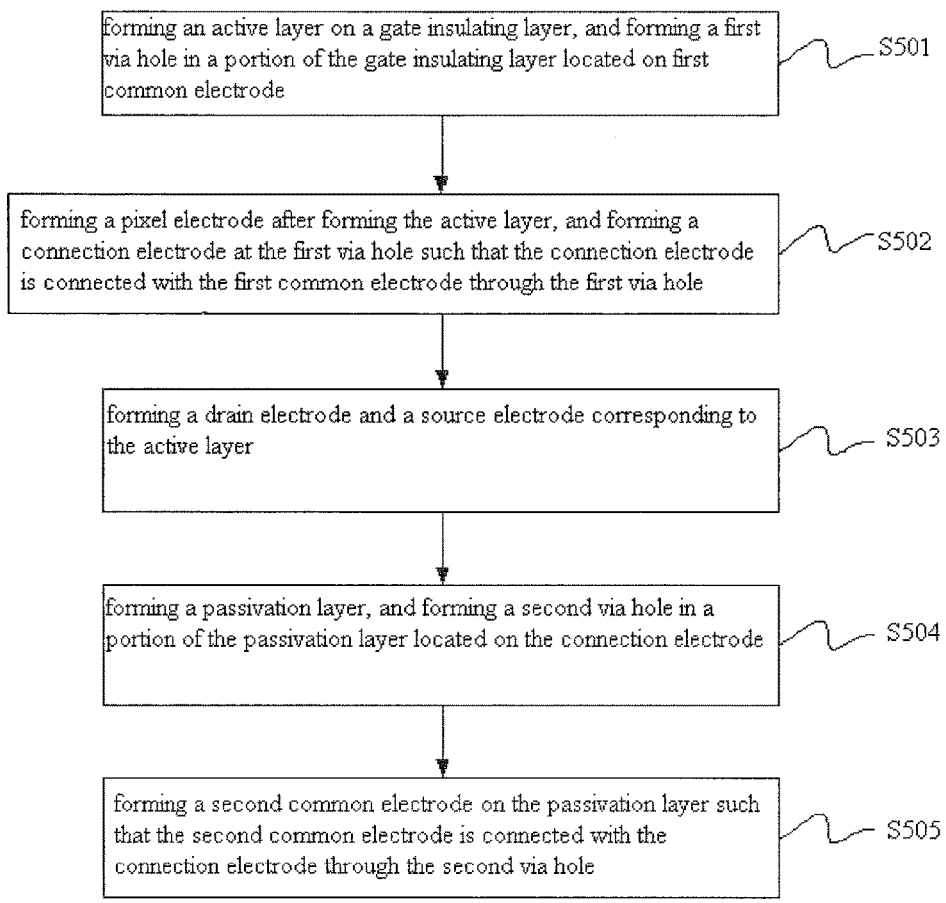
FIG. 6 is a flow chart showing a method of manufacturing the thin film transistor shown in FIG. 3, according to an embodiment of the present application.

As shown in FIG. 6, an embodiment of the present application further provides a method of manufacturing a thin film transistor, comprising forming a gate, a first common electrode and a gate insulating layer successively on a base substrate, wherein the gate is located in a same layer as the first common electrode. The method further comprises following steps:

S501 of forming an active layer on the gate insulating layer, and forming a first via hole in a portion of the gate insulating layer located on the first common electrode; in an example, the step S501 may include:

etching the portion of the gate insulating layer located on the first common electrode so as to form the first via hole, and forming the active layer on the gate insulating layer through exposure by using a mask; or forming the active layer on the gate insulating layer through exposure by using a mask, and etching the portion of the gate insulating layer located on the first common electrode so as to form the first via hole;

S502 of forming the pixel electrode after forming the active layer, and forming the connection electrode at the first via hole such that the connection electrode is connected with the first common electrode through the first via hole; in an example, the connection electrode may be made of a same material as the pixel electrode, for example, may be a transparent conductive layer; obviously, the connection electrode may be made of other suitable material(s), and any material, which can be used to form an electrode connected or electrically connected with the first common electrode through the first via hole, falls within the protective scope of the present application;

S503 of forming a drain electrode and a source electrode corresponding to the active layer;

S504 of forming a passivation layer, and forming a second via hole in a portion of the passivation layer located on the connection electrode; and S505 of forming a second common electrode on the passivation layer such that the second common electrode is connected with the connection electrode through the second via hole.

In an example, the method may further comprise:

at step S503, forming a third common electrode while forming the drain electrode and the source electrode, such that the third common electrode is connected with the connection electrode;

at step S504, forming the passivation layer, and forming a second via hole in a portion of the passivation layer located on the third common electrode; and at step S505, forming the second common electrode on the passivation layer such that the second common electrode is connected with the third common electrode through the second via hole.

It is noted that the term "forming" used herein is a general concept for manufacturing a component/part/member through various processes. For example, forming the active layer, the pixel electrode, the source/drain electrode, the passivation layer, the second common electrode or the like may include depositing the layer or material, and may also include processes, such as mask, exposure, development and the like, which are known for those skilled in the art and are necessary for forming particular pattern(s).

With the method of manufacturing a thin film transistor according to embodiments of the present application, the connection electrode is provided in the same layer as the pixel electrode, and the first via hole is provided in a portion of the gate insulating layer located on the first common electrode, such that the connection electrode is connected with the first common electrode through the first via hole; the third common electrode is provided in the same layer as the source-drain electrode layer so as to be connected with the connection electrode, and then the second via hole is provided in a portion of the passivation layer located on the third common electrode, such that the third common electrode is connected with the second common electrode through the second via hole. Thus, the first common electrode is connected with the second common electrode through the first via hole, the connection electrode, the third common electrode and the second via hole, that is, the connection between the first common electrode and the second common electrode is achieved through the two via holes and the connection electrode and the third common electrode between the two via holes, so that respective via holes have smaller depths, which are respectively equal to the thickness of the gate insulating layer and the thickness of the passivation layer, and the success ratio in lapping and connecting the connection electrode with the first common electrode through the first via hole will be higher, the success ratio in lapping and connecting the second common electrode with the third common electrode through the second via hole will be also higher, and the success ratio in lapping and connecting the third common electrode with the connection electrode will be also higher, thereby the success ratio for lapping connection between the second common electrode and the first common electrode may be increased as a whole, while the phenomenon where defective pixel(s) occurs in the display panel during PI coating may be reduced. Further, no new mask will be added for manufacturing the thin film transistor provided according to the embodiments of the present application.

Second Embodiment

Hereinafter, a method of manufacturing a thin film transistor according to an embodiment of the present application will be described in detail with reference to the drawings.

In the second embodiment 2, a method of manufacturing the thin film transistor provided in the first embodiment of the present application and including the connection electrode and the third common electrode will be mainly described in detail.

Figure 7A:
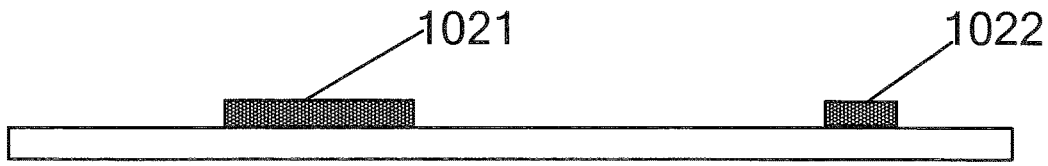
FIG. 7a-7g are structural schematic diagrams according to an embodiment of the present application, showing processes of manufacturing the thin film transistor shown in FIG. 4.
Figure 7B:
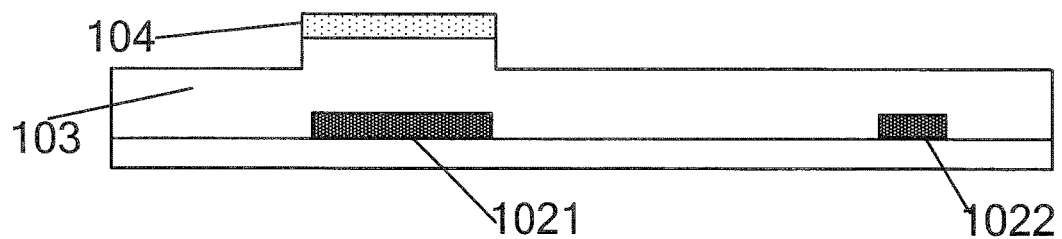
Figure 7C:
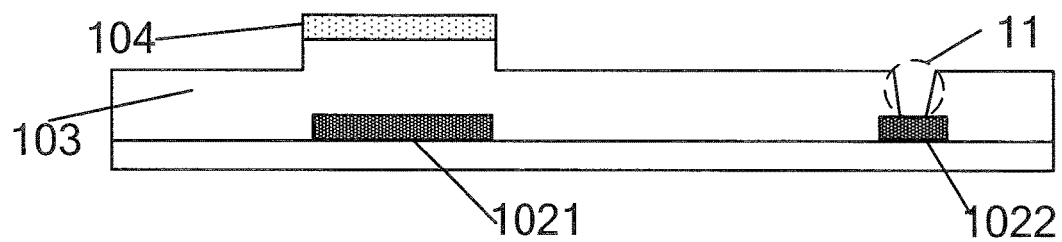
Figure 7D:
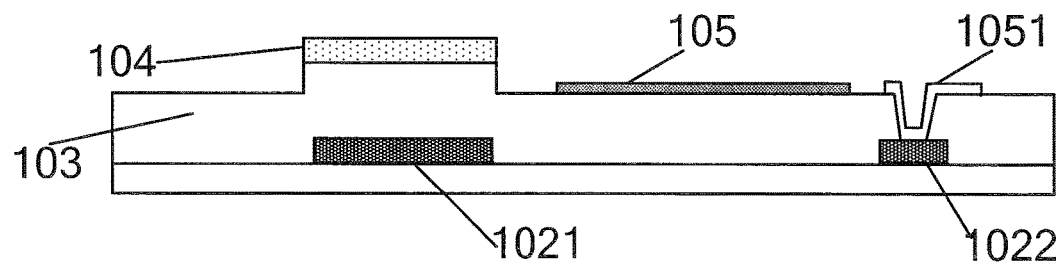
Figure 7E:
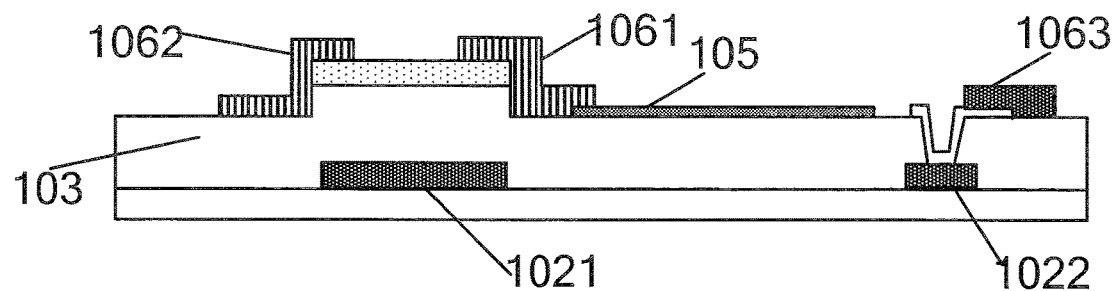
Figure 7F:
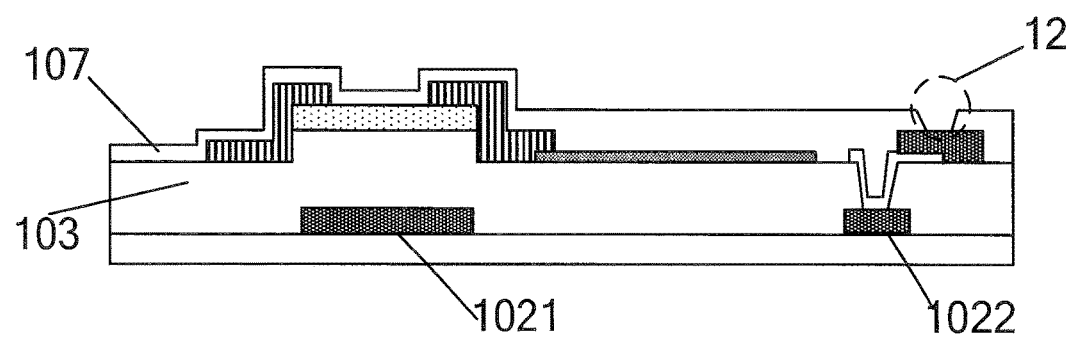
Figure 7G:
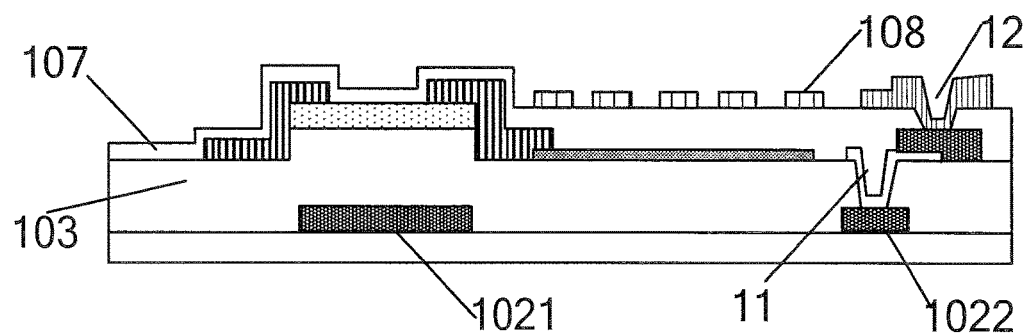

The method of manufacturing a thin film transistor according to this embodiment of the present application comprises:

step 1 of forming the gate 1021 and the first common electrode 1022 on a base substrate through processes such as coating, masking exposure (exposure by masks) and the like, as shown in FIG. 7a;

step 2 of forming the gate insulating layer 103 and the active layer 104 through chemical vapor deposition (CVD) processes, as shown in FIG. 7b;

step 3 of, as shown in FIG. 7c, coating a layer of photoresist and exposing the layer of photoresist through a mask so as to form a pattern including a Full Tone region corresponding to the active layer 104 and a Half Tone region corresponding to portions of the gate insulating layer which are not covered by the active layer, the Half Tone region not including a portion of the gate insulating layer located on the first common electrode; removing the portion of the gate insulating layer located on the first common electrode by performing a dry etching process on the substrate after the exposure, so as to form the first via hole 11; performing ashing and etching processes on the substrate so as to remove the photoresist from the Half Tone region; and performing a dry etching process on the substrate so as to form a silicon island as the active layer 104;

step 4 of forming the pixel electrode 105 while forming the connection electrode 1051 through processes such as coating, masking exposure (exposure by masks), etching and the like, such that the connection electrode is connected with the first common electrode through the first via hole, as shown in FIG. 7d;

step 5 of forming the drain electrode 1062 and the source electrode 1061 while forming third common electrode 1063 through processes such as coating, masking exposure (exposure by masks), etching and the like, such that the third common electrode is connected with the connection electrode, as shown in FIG. 7e;

step 6 of forming the passivation layer 107 through processes such as coating, masking exposure (exposure by masks), etching and the like, and then etching off a portion of the passivation layer located on the third common electrode so as to form the second via hole 12, and in this way the second via hole 12 has a depth equal to the thickness of the passivation layer, as shown in FIG. 7f; and step 7 of forming the second common electrode 108 through processes such as coating, masking exposure (exposure by masks), etching and the like, such that the second common electrode is connected with the third common electrode 1063 through the second via hole 12, as shown in FIG. 7g.

It is noted that although embodiments of the present application are described by taking a thin film transistor, which is designed for a HADS product, as an example, the present application is also applicable to other types of products.

In summary, with the thin film transistor according to one embodiment of the present application, the connection electrode is provided in the same layer as the pixel electrode, and the first via hole is provided in a portion of the gate insulating layer located on the first common electrode, such that the connection electrode is connected with the first common electrode through the first via hole; the third common electrode is provided in the same layer as the source-drain electrode layer so as to be connected with the connection electrode, and then the second via hole is provided in a portion of the passivation layer located on the third common electrode, such that the third common electrode is connected with the second common electrode through the second via hole. Thus, the first common electrode is connected with the second common electrode through the first via hole, the connection electrode, the third common electrode and the second via hole, that is, the connection between the first common electrode and the second common electrode is achieved through the two via holes and the connection electrode and the third common electrode between the two via holes, so that respective via holes have smaller depths, which are respectively equal to the thickness of the gate insulating layer and the thickness of the passivation layer, and the success ratio in lapping and connecting the connection electrode with the first common electrode through the first via hole will be higher, the success ratio in lapping and connecting the second common electrode with the third common electrode through the second via hole will be also higher, and the success ratio in lapping and connecting the third common electrode with the connection electrode will be also higher, thereby the success ratio for lapping connection between the second common electrode and the first common electrode may be increased as a whole, while the phenomenon where defective pixel(s) occurs in the display panel during PI coating may be reduced. Further, no new mask will be added for manufacturing the thin film transistor provided according to the embodiments of the present application, which will not lead to complex processes.

Obviously, various modifications and changes may be made to the present disclosure by those skilled in the art without departing from the principles and spirit of the present application. As such, these modifications and changes to the present application are also intended to be included within the present application if they fall within the scopes of the present application defined by claims and equivalents thereof.

What is claimed is:

1. A thin film transistor comprising, successively from the bottom up, a gate, a first common electrode located in a same layer as the gate, a gate insulating layer, an active layer, a pixel electrode, a source-drain electrode layer and a passivation layer located above the layer where the gate is located, and a second common electrode located on the passivation layer, wherein, the thin film transistor further comprises at least one connection electrode located in a same layer as the pixel electrode, wherein at least two via holes are provided between the first common electrode and the second common electrode so as to connect the first common electrode and the second common electrode through the connection electrode.

2. The thin film transistor according to claim 1, wherein the connection electrode is provided between two adjacent ones of the at least two via holes.

3. The thin film transistor according to claim 2, wherein the at least two via holes comprises a first via hole provided in the gate insulating layer and a second via hole provided in the passivation layer, and wherein the first common electrode is connected with the connection electrode through the first via hole, and the connection electrode is connected with the second common electrode through the second via hole.

4. The thin film transistor according to claim 3, wherein the thin film transistor further comprise at least one third common electrode located in a same layer as the source-drain electrode layer, wherein each third common electrode is connected with a corresponding connection electrode, and the third common electrode is connected with the second common electrode through the second via hole.

5. The thin film transistor according to claim 3, wherein the first via hole has a depth equal to the thickness of the gate insulating layer, and the second via hole has a depth equal to the thickness of the passivation layer.

6. The thin film transistor according to claim 2, wherein the thin film transistor further comprise at least one third common electrode located in a same layer as the source-drain electrode layer, wherein each third common electrode is connected with a corresponding connection electrode.

7. The thin film transistor according to claim 1, wherein the connection electrode is a transparent conductive layer.

8. An array substrate, comprising the thin film transistor according to claim 1.

9. The array substrate according to claim 8, wherein the connection electrode is provided between two adjacent ones of the at least two via holes.

10. The array substrate according to claim 9, wherein the at least two via holes comprises a first via hole provided in the gate insulating layer and a second via hole provided in the passivation layer, and wherein the first common electrode is connected with the connection electrode through the first via hole, and the connection electrode is connected with the second common electrode through the second via hole.

11. The array substrate according to claim 10, wherein the thin film transistor further comprise at least one third common electrode located in a same layer as the source-drain electrode layer, wherein each third common electrode is connected with a corresponding connection electrode, and the third common electrode is connected with the second common electrode through the second via hole.

12. The array substrate according to claim 10, wherein the first via hole has a depth equal to the thickness of the gate insulating layer, and the second via hole having a depth equal to the thickness of the passivation layer.

13. The array substrate according to claim 9, wherein the thin film transistor further comprise at least one third common electrode located in a same layer as the source-drain electrode layer, wherein each third common electrode is connected with a corresponding connection electrode.

14. The array substrate according to claim 8, wherein the connection electrode is a transparent conductive layer.

15. A display panel, comprising the array substrate according to claim 8.

16. A method of manufacturing the thin film transistor according to claim 1, comprising forming the gate, the first common electrode and the gate insulating layer successively on a base substrate, wherein the gate is located in a same layer as the first common electrode, and the method further comprises:
- forming the active layer on the gate insulating layer, and forming a first via hole in a portion of the gate insulating layer located on the first common electrode;
- forming the pixel electrode after forming the active layer, and forming the connection electrode at the first via hole such that the connection electrode is connected with the first common electrode through the first via hole;
- forming a drain electrode and a source electrode corresponding to the active layer;
- forming the passivation layer, and forming a second via hole in a portion of the passivation layer located on the connection electrode;
- forming the second common electrode on the passivation layer such that the second common electrode is connected with the connection electrode through the second via hole.

17. The method according to claim 16, wherein forming the active layer on the gate insulating layer, and forming the first via hole in the portion of the gate insulating layer located on the first common electrode comprise:
- etching the portion of the gate insulating layer located on the first common electrode so as to form the first via hole, and forming the active layer on the gate insulating layer through exposure by using a mask; or
- forming the active layer on the gate insulating layer through exposure by using a mask, and etching the portion of the gate insulating layer located on the first common electrode so as to form the first via hole.

18. A method of manufacturing the thin film transistor according to claim 1, comprising forming the gate, the first common electrode and the gate insulating layer successively on a base substrate, wherein the gate is located in a same layer as the first common electrode, and the method further comprises:
- forming the active layer on the gate insulating layer, and forming a first via hole in a portion of the gate insulating layer located on the first common electrode;
- forming the pixel electrode after forming the active layer, and forming the connection electrode at the first via hole such that the connection electrode is connected with the first common electrode through the first via hole;
- forming a drain electrode, a source electrode and a third common electrode at the same time such that the third common electrode is connected with the connection electrode;
- forming the passivation layer, and forming a second via hole in a portion of the passivation layer located on the third common electrode;
- forming the second common electrode on the passivation layer such that the second common electrode is connected with the third common electrode through the second via hole.

19. The method according to claim 18, wherein forming the active layer on the gate insulating layer, and forming the first via hole in the portion of the gate insulating layer located on the first common electrode comprise:
- etching the portion of the gate insulating layer located on the first common electrode so as to form the first via hole, and forming the active layer on the gate insulating layer through exposure by using a mask; or
- forming the active layer on the gate insulating layer through exposure by using a mask, and etching the portion of the gate insulating layer located on the first common electrode so as to form the first via hole.

* * * * *